(12) United States Patent
Fujiwara

(10) Patent No.: US 7,915,695 B2
(45) Date of Patent: Mar. 29, 2011

(54) SEMICONDUCTOR DEVICE COMPRISING GATE ELECTRODE

(75) Inventor: Hideaki Fujiwara, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 286 days.

(21) Appl. No.: 11/443,152

(22) Filed: May 31, 2006

(65) Prior Publication Data

US 2006/0267095 A1    Nov. 30, 2006

(30) Foreign Application Priority Data

May 31, 2005    (JP) .................................. 2005-158735

(51) Int. Cl.
*H01L 29/78* (2006.01)

(52) U.S. Cl. ........................................ 257/412; 257/410

(58) Field of Classification Search .................. 257/410, 257/412

See application file for complete search history.

(56) References Cited

U.S. PATENT DOCUMENTS

| 5,926,360 | A | * | 7/1999 | Laibowitz et al. ........... 361/321.4 |
| 6,020,260 | A | * | 2/2000 | Gardner ........................ 438/657 |
| 6,727,130 | B2 | | 4/2004 | Kim et al. |
| 7,005,697 | B2 | * | 2/2006 | Batra et al. ..................... 257/315 |
| 7,375,403 | B2 | | 5/2008 | Kaneko et al. |
| 7,687,869 | B2 | | 3/2010 | Kaneko et al. |
| 2003/0183901 | A1 | * | 10/2003 | Kanda et al. .................. 257/510 |
| 2004/0000695 | A1 | * | 1/2004 | Matsuo .......................... 257/412 |
| 2004/0014306 | A1 | | 1/2004 | Komatsu |
| 2004/0080001 | A1 | | 4/2004 | Takeuchi |
| 2005/0167762 | A1 | * | 8/2005 | Kadoshima et al. .......... 257/392 |
| 2010/0159686 | A1 | | 6/2010 | Kaneko et al. |

FOREIGN PATENT DOCUMENTS

| JP | 2000-252370 | 9/2000 |
| JP | 2002-359295 | 12/2002 |
| JP | 2003-023152 | 1/2003 |
| JP | 2003-204000 | 7/2003 |
| JP | 2004-165346 | 6/2004 |
| JP | 2005-108875 | 4/2005 |

OTHER PUBLICATIONS

Japanese Notification of Reasons for Rejection, with English Translation, issued in Japanese Patent Application No. 2005-158735, dated Aug. 24, 2010.

* cited by examiner

*Primary Examiner* — Thao X Le
*Assistant Examiner* — Tanika Warrior
(74) *Attorney, Agent, or Firm* — McDermott Will & Emery LLP

(57) ABSTRACT

A semiconductor device capable of reducing deterioration of electron mobility while suppressing depletion of gate electrodes is provided. This semiconductor device includes a metal-containing layer so formed that at least either a first gate electrode or a second gate electrode partially covers a corresponding first or second gate insulating film and a semiconductor layer formed on the metal-containing layer to come into contact with a portion of the corresponding first or second gate insulating film not covered with the metal-containing layer. The first and second gate electrodes contain metals different from each other.

15 Claims, 10 Drawing Sheets

SEMICONDUCTOR DEVICE COMPRISING GATE ELECTRODE

BACKGROUND OF THE INVENTION

1. Field of the Invention

The present invention relates to a semiconductor device, and more particularly, it relates to a semiconductor device comprising first conductive type source/drains region and second conductive type source/drain regions.

2. Description of the Background Art

A dual-gate CMOS (complementary metal oxide semiconductor) device constituted of an n-channel MOS transistor having n-type source/drain regions and a gate electrode formed by an n-type polysilicon layer and a p-channel MOS transistor having p-type source/drain regions and a gate electrode formed by a p-type polysilicon layer is known in general. In this conventional dual-gate CMOS device, the gate electrodes of the n- and p-channel MOS transistors formed by the polysilicon layers are disadvantageously depleted. In this regard, there is proposed a dual-gate CMOS device capable of solving this problem of depletion of gate electrodes (refer to Japanese Patent Laying-Open No. 2004-165346, for example).

In the dual-gate CMOS device proposed in the aforementioned Japanese Patent Laying-Open No. 2004-165346, gate electrodes of n- and p-channel MOS transistors are formed by metal layers, for solving the problem of depletion of gate electrodes of a semiconductor (polysilicon).

In the dual-gate CMOS device proposed in the aforementioned Japanese Patent Laying-Open No. 2004-165346, however, the gate electrodes of the n- and p-channel MOS transistors are constituted of only the metal layers formed to cover the overall upper surfaces of corresponding gate insulating films respectively, to disadvantageously increase the difference between the thermal expansion coefficients of the gate electrodes and a substrate formed with the gate insulating films and source/drain regions. After heat treatment at a temperature of about 1000° C., therefore, stress acting between the gate electrodes and the gate insulating films and the substrate is so increased that electron mobility in the substrate is deteriorated due to this stress.

SUMMARY OF THE INVENTION

The present invention has been proposed in order to solve the aforementioned problem, and an object of the present invention is to provide a semiconductor device capable of reducing deterioration of electron mobility while suppressing depletion of gate electrodes.

In order to attain the aforementioned object, a semiconductor device according to an aspect of the present invention comprises a pair of first conductive type first source/drain regions formed on the main surface of a semiconductor region at a prescribed interval to hold a first channel region therebetween, a first gate electrode formed on the first channel region through a first gate insulating film, a pair of second conductive type second source/drain regions formed on the main surface of the semiconductor region at a prescribed interval to hold a second channel region therebetween and a second gate electrode formed on the second channel region through a second gate insulating film. At least either the first gate electrode or the second gate electrode includes a metal-containing layer so formed as to partially cover the corresponding first gate insulating film or the corresponding second insulating film and a semiconductor layer formed on the metal-containing layer to come into contact with a portion of the corresponding first gate insulating film or the corresponding second gate insulating film not covered with the metal-containing layer, and the first gate electrode and the second gate electrode contain metals different from each other.

In the semiconductor device according to this aspect, as hereinabove described, at least either the first gate electrode or the second gate electrode includes the metal-containing layer so formed as to partially cover the corresponding first gate insulating film or the corresponding second insulating film so that at least either the first gate electrode or the second gate electrode can be inhibited from depletion dissimilarly to a case of constituting the gate electrodes of only semiconductor layers formed on the gate insulating films. Further, at least either the first gate electrode or the second gate electrode includes the metal-containing layer so formed as to partially cover the corresponding first gate insulating film or the corresponding second gate insulating film and the semiconductor layer formed on the metal-containing layer to come into contact with the portion of the corresponding first gate insulating film or the corresponding second insulating film not covered with the metal-containing layer, whereby stress acting between the metal-containing layer and the corresponding first (second) gate insulating film and the semiconductor region can be reduced as compared with a case of forming a metal layer to cover the overall surface of the gate insulating film. Thus, deterioration of electron mobility resulting from stress acting between the metal-containing layer and the gate insulating film and the semiconductor region can be reduced. Further, the first and second gate electrodes so contain the metals different from each other that the effective work functions of a first gate electrode of an n-channel transistor and a second gate electrode of a p-channel transistor can be individually adjusted due to the different metals contained in the first and second gate electrodes respectively when the n-channel transistor is constituted of the first source/drain regions, the first gate insulating film and the first gate electrode while the p-channel transistor is constituted of the second source/drain regions, the second gate insulating film and the second gate electrode, for example. Thus, the threshold voltages of the n- and p-channel transistors can be individually adjusted to proper values in the semiconductor device including the n- and p-channel transistors.

In the semiconductor device according to the aforementioned aspect, the metal-containing layer is preferably formed in a dot pattern. According to this structure, the metal-containing layer can be easily formed to partially cover the first or second gate insulating film.

In the semiconductor device according to the aforementioned aspect, the first gate insulating film and the second gate insulating film are preferably made of materials different from each other. When an n-channel transistor is constituted of the first source/drain regions, the first gate insulating film and the first gate electrode while a p-channel transistor is constituted of the second source/drain regions, the second gate insulating film and the second gate electrode in this case, the energy levels where a charge neutral point forming the center for pinning the Fermi level of the first gate electrode on the interface between the first gate insulating film and the first gate electrode of the n-channel transistor and another charge neutral point forming the center for pinning the Fermi level of the second gate electrode on the interface between the second gate insulating film and the second gate electrode of the p-channel transistor are located can be individually set due to the first and second gate insulating films made of the materials different from each other. Thus, the charge neutral points forming the centers for pinning the Fermi levels of the gate electrodes of the p- and n-channel transistors can be individually set to proper energy levels in the semiconductor device including the n- and p-channel transistors.

In the semiconductor device according to the aforementioned aspect, the semiconductor layer preferably includes a lower semiconductor layer formed on the metal-containing layer and an upper semiconductor layer formed on the lower semiconductor layer with a thickness larger than the thickness of the lower semiconductor layer. According to this structure, removal of the metal-containing layer can be suppressed due to the lower semiconductor layer in a wet etching step with acid or a substrate cleaning step carried out on the semiconductor device having the lower semiconductor layer formed on the metal-containing layer, for example. Further, the semiconductor layer of at least either the first gate electrode or the second gate electrode includes the lower semiconductor layer formed on the metal-containing layer and the upper semiconductor layer having the thickness larger than that of the lower semiconductor layer so that the thickness of the lower semiconductor layer is smaller than that of the semiconductor layer formed by the upper and lower semiconductor layers, whereby a prescribed region can be easily removed from the lower semiconductor layer, formed on the metal-containing layer, having the small thickness by RIE (reactive ion etching).

In the semiconductor device according to the aforementioned aspect, the first gate electrode preferably includes a first metal-containing layer so formed as to partially cover the first gate insulating film and a first semiconductor layer formed on the first metal-containing layer to come into contact with a portion of the first gate insulating film not covered with the first metal-containing layer, the second gate electrode preferably includes a second metal-containing layer so formed as to partially cover the second gate insulating film and a second semiconductor layer formed on the second metal-containing layer to come into contact with a portion of the second gate insulating film not covered with the second metal-containing layer, and the first metal-containing layer and the second metal-containing layer preferably contain metals different from each other. According to this structure, both of the first and second gate electrodes can be inhibited from depletion due to the first and second metal-containing layers of the first and second gate electrodes. Further, the first gate electrode includes the first metal-containing layer so formed as to partially cover the first gate insulating film and the first semiconductor layer formed on the first metal-containing layer to come into contact with the portion of the first gate insulating film not covered with the first metal-containing layer while the second gate electrode includes the second metal-containing layer so formed as to partially cover the second gate insulating film and the second semiconductor layer formed on the second metal-containing layer to come into contact with the portion of the second gate insulating film not covered with the second metal-containing layer, whereby deterioration of electron mobility resulting from stress acting between both of the first and second metal-containing layers and the gate insulating films and the semiconductor region can be reduced.

In the aforementioned semiconductor device including the first and second semiconductor layers, the first source/drain regions are preferably n-type regions while the second source/drain regions are preferably p-type regions, and the first gate insulating film preferably contains a metal forming a level on a side closer to a conduction band of the first semiconductor layer than an intermediate energy level between the conduction band and a valence band of the first semiconductor layer. According to this structure, the Fermi level of the first gate electrode of the n-channel transistor including the n-type first source/drain regions can be rendered easily fixable to the level on the side closer to the conduction band of the first semiconductor layer through the metal, contained in the first gate insulator film, forming the level on the side closer to the conduction band of the first semiconductor layer than the intermediate energy level (mid gap) between the conduction band and the valence band of the first semiconductor layer. Thus, the effective work function of the first gate electrode of the n-channel transistor can be adjusted to a smaller level, whereby the threshold voltage of the n-channel transistor can be controlled to a lower level. In this case, the first gate insulating film may include an $HfO_x$ film.

In the aforementioned semiconductor device including the first and second semiconductor layers, the first source/drain regions are preferably n-type regions while the second source/drain regions are preferably p-type regions, and the second gate insulating film preferably contains a metal forming a level on a side closer to a valence band of the second semiconductor layer than an intermediate energy level between a conduction band and the valence band of the second semiconductor layer. According to this structure, the Fermi level of the second gate electrode of the p-channel transistor including the p-type second source/drain regions can be rendered easily fixable to the level on the side closer to the valence band of the second semiconductor layer through the metal, contained in the second gate insulator film, forming the level on the side closer to the valence band of the second semiconductor layer than the intermediate energy level (mid gap) between the conduction band and the valence band of the second semiconductor layer. Thus, the effective work function of the second gate electrode of the p-channel transistor can be adjusted to a larger level, whereby the threshold voltage of the p-channel transistor can be controlled to a lower level. In this case, the second gate insulating film may include an $Al_2O_3$ film.

In the aforementioned semiconductor device including the first and second semiconductor layers, the first source/drain regions are preferably n-type regions while the second source/drain regions are preferably p-type regions, the first metal-containing layer preferably contains a first metal forming a level on a side closer to a conduction band of the first semiconductor layer than an intermediate energy level between the conduction band and a valence band of the first semiconductor layer, and the second metal-containing layer preferably contains a second metal forming a level on a side closer to a valence band of the second semiconductor layer than an intermediate energy level between a conduction band and the valence band of the second semiconductor layer. According to this structure, the Fermi level of the first gate electrode of the n-channel transistor including the n-type first source/drain regions can be rendered easily fixable to the level on the side closer to the conduction band of the first semiconductor layer through the first metal, contained in the first metal-containing layer, forming the level on the side closer to the conduction band of the first semiconductor layer than the intermediate energy level (mid gap) between the conduction band and the valence band of the first semiconductor layer. Thus, the effective work function of the first gate electrode of the n-channel transistor can be adjusted to a smaller level, whereby the threshold voltage of the n-channel transistor can be controlled to a lower level. Further, the Fermi level of the second gate electrode of the p-channel transistor including the p-type second source/drain regions can be rendered easily fixable to the level on the side closer to the valence band of the second semiconductor layer through the second metal, contained in the second metal-containing layer, forming the level on the side closer to the valence band of the second semiconductor layer than the intermediate energy level (mid gap) between the conduction band and the valence band of the second semiconductor layer. Thus, the effective work function of the second gate electrode of the p-channel transistor can be adjusted to a larger level, whereby the threshold voltage of the p-channel transistor can be controlled to a lower level. As hereinabove described, the threshold voltages of both of the n- and p-channel transistors can be controlled to lower levels in the semiconductor device constituted of the n- and p-channel transistors.

In the aforementioned semiconductor device having the first and second metal-containing layers containing the first and second metals respectively, the first metal-containing layer may include a metal silicide layer containing the first metal, and the second metal-containing layer may include another metal silicide layer containing the second metal.

In the aforementioned semiconductor device having the first and second metal-containing layers containing the first and second metals respectively, the first metal may be Hf, and the second metal may be Pt.

In the aforementioned semiconductor device having the first and second metal-containing layers containing the first and second metals respectively, further, the first metal-containing layer may further contain a third metal forming a level around the intermediate energy level between the conduction band and the valence band of the first semiconductor layer in addition to the first metal. In the aforementioned semiconductor device having the first and second metal-containing layers containing the first and second metals respectively, in addition, the second metal-containing layer may further contain a fourth metal forming a level around the intermediate energy level between the conduction band and the valence band of the first semiconductor layer.

In the semiconductor device according to the aforementioned aspect, the first gate electrode preferably includes the metal-containing layer so formed as to partially cover the first gate insulating film and the semiconductor layer formed on the metal-containing layer to come into contact with a portion of the first gate insulating film not covered with the metal-containing layer, the second gate electrode preferably consists of a metal silicide layer formed on the second gate insulating film, and the metal-containing layer and the metal silicide layer preferably contain metals different from each other. According to this structure, both of the first and second gate electrodes can be inhibited from depletion due to the metal-containing layer of the first gate electrode and the metal silicide layer of the second gate electrode. Further, the first gate electrode includes the metal-containing layer so formed as to partially cover the first gate insulating film and the semiconductor layer formed on the metal-containing layer to come into contact with the portion of the first gate insulating film not covered with the metal-containing layer, whereby deterioration of electron mobility resulting from stress acting between the metal-containing layer and the first gate insulating film and the semiconductor region can be reduced.

In the aforementioned semiconductor device including the metal-containing layer and the metal silicide layer, the metal-containing layer is preferably formed on the first gate insulating film in a dot pattern, and the metal silicide layer is preferably so formed as to cover substantially the overall surface of the second gate insulating film. According to this structure, the metal-containing layer can be easily formed to partially cover the first gate insulating film.

In the aforementioned semiconductor device including the metal-containing layer and the metal silicide layer, the first source/drain regions are preferably n-type regions while the second source/drain regions are preferably p-type regions, the metal-containing layer preferably contains a metal forming a level on a side closer to a conduction band of the semiconductor layer than an intermediate energy level between the conduction band and a valence band of the semiconductor layer, and the metal silicide layer preferably contains a metal forming a level on a side closer to a valence band of silicon than an intermediate energy level between a conduction band and the valence band of silicon. According to this structure, the Fermi level of the first gate electrode of the n-channel transistor including the n-type first source/drain regions can be rendered easily fixable to the level on the side closer to the conduction band of the semiconductor layer (silicon layer, for example) through the metal, contained in the metal-containing film, forming the level on the side closer to the conduction band of the semiconductor layer (silicon layer) than the intermediate energy level (mid gap) between the conduction band and the valence band of the semiconductor layer. Thus, the effective work function of the first gate electrode of the n-channel transistor can be adjusted to a smaller level, whereby the threshold voltage of the n-channel transistor can be controlled to a lower level. Further, the Fermi level of the second gate electrode of the p-channel transistor including the p-type second source/drain regions can be rendered easily fixable to the level on the side closer to the valence band of silicon through the metal, contained in the metal silicide film, forming the level on the side closer to the valence band of silicon than the intermediate energy level (mid gap) between the conduction band and the valence band of silicon. Thus, the effective work function of the second gate electrode of the p-channel transistor can be adjusted to a larger level as compared with a case where the gate electrode is formed by a silicon layer, whereby the threshold voltage of the p-channel transistor can be controlled to a lower level. As hereinabove described, the threshold voltages of both of the n- and p-channel transistors can be controlled to lower levels in the semiconductor device constituted of the n- and p-channel transistors.

In the aforementioned semiconductor device including the metal-containing layer and the metal silicide layer, the metal silicide layer may include a lower metal silicide layer so formed as to come into contact with the second gate insulating film and an upper metal silicide layer formed on the lower metal silicide layer with a thickness larger than the thickness of the lower metal silicide layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. The following embodiments of the present invention are applied to CMOS devices employed as exemplary semiconductor devices according to the present invention.

First Embodiment

The structure of a CMOS device according to a first embodiment of the present invention is described with reference to FIG. 1.

Figure 1:
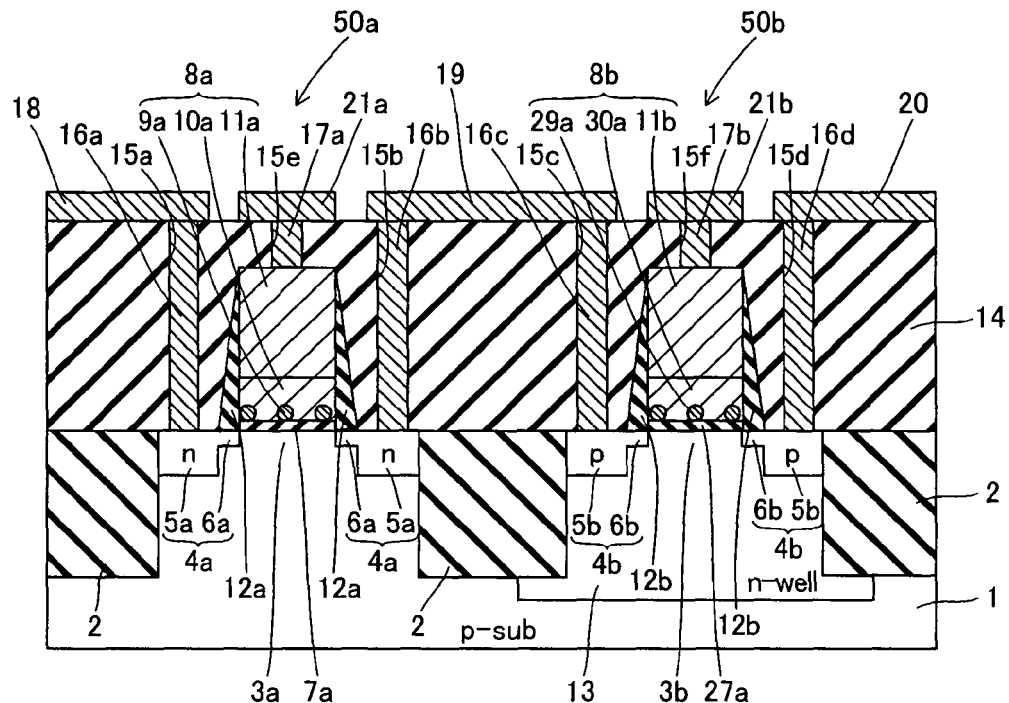
FIG. 1 is a sectional view showing the structure of a CMOS device according to a first embodiment of the present invention.

In the CMOS device according to the first embodiment, element isolation films 2 of $SiO_2$ are formed on prescribed regions of a p-type silicon substrate 1, as shown in FIG. 1. The silicon substrate 1 is an example of the "semiconductor region" in the present invention. On a region for forming an n-channel MOS transistor 50a constituting the CMOS device according to the first embodiment, a pair of n-type source/drain regions 4a are formed on the silicon substrate 1 at a prescribed interval, to hold a p-type channel region 3a therebetween. The p-type channel region 3a is an example of the "first channel region" in the present invention, and the n-type source/drain regions 4a are examples of the "first source/drain regions" in the present invention. Each of the n-type source/drain regions 4a is constituted of an n-type high-concentration impurity region 5a and an n-type low-concentration impurity region 6a having a lower impurity concentration than the n-type high-concentration impurity region 5a. The n-type low-concentration impurity region 6a is formed on a region, shallower than the n-type high-concentration impurity region 5a, closer to a gate electrode 8a described later than the n-type high-concentration impurity region 5a.

A gate insulating film 7a is formed on the p-type channel region 3a. This gate insulating film 7a is an example of the "first gate insulating film" in the present invention. The gate insulating film 7a is formed by an $HfO_x$ film, which is a high dielectric constant (high-k) insulating film. The gate insulating film 7a is so formed by the $HfO_x$ film that a charge neutral point forming the center for pinning the Fermi level of the gate electrode 8a constituting the n-channel MOS transistor 50a is located on a side closer to a conduction band of silicon on the interface between the gate insulating film 7a and the gate electrode 8a described later due to an effect of Hf contained in the $HfO_x$ film. The $HfO_x$ film constituting the gate insulating film 7a has a relative dielectric constant higher than 3.9 and a thickness of not more than about 6 nm in terms of an oxide film ($SiO_2$ film). The gate electrode 8a is formed on the gate insulating film 7a. This gate electrode 8a is an example of the "first gate electrode" in the present invention. The gate electrode 8a is constituted of a metal-containing layer 9a formed on the gate insulating film 7a, an $n^+$-type lower polysilicon layer 10a formed on the metal-containing layer 9a and an $n^+$-type upper polysilicon layer 11a formed on the lower polysilicon layer 10a. The metal-containing layer 9a is an example of the "first metal-containing layer" in the present invention. The lower polysilicon layer 10a is an example of the "lower semiconductor layer" or the "first semiconductor layer" in the present invention, and the upper polysilicon layer 11a is an example of the "upper semiconductor layer" in the present invention.

The metal-containing layer 9a has an average thickness of less than about 3 nm (upon formation). The metal-containing layer 9a having the small thickness is formed in a dot pattern, to partially cover the gate insulating film 7a. The metal-containing layer 9a contains TaN and Hf silicide (HfSi). TaN contained in the metal-containing layer 9a forms a level around an intermediate energy level (mid gap) between a conduction band and a valence band of silicon, while Hf silicide (HfSi) forms a level around the conduction band of silicon. The $n^+$-type lower polysilicon layer 10a is in contact with portions of the gate insulating film 7a not covered with the metal-containing layer 9a through regions between adjacent dots of the metal-containing layer 9a. This lower polysilicon layer 10a has a thickness of about 10 nm. Further, the $n^+$-type lower polysilicon layer 10a has a Fermi level located around the conduction band of silicon. The $n^+$-type upper polysilicon layer 11a has a thickness of about 100 nm, which is larger than the thickness (about 10 nm) of the lower polysilicon layer 10a. Side wall insulating films 12a of $SiO_2$ are formed on both side surfaces of the gate electrode 8a and the gate insulating film 7a respectively. The p-type channel region 3a, the pair of n-type source/drain regions 4a, the gate insulating film 7a and the gate electrode 8a constitute the n-channel MOS transistor 50a.

On a region for forming a p-channel MOS transistor 50b constituting the CMOS device according to the first embodiment, on the other hand, an n-type well region 13 is formed on the silicon substrate 1, as shown in FIG. 1. A pair of p-type source/drain regions 4b are formed in the n-type well region 13 at a prescribed interval, to hold an n-type channel region 3b therebetween. The n-type channel region 3b is an example of the "second channel region" in the present invention, and the p-type source/drain regions 4b are examples of the "second source/drain regions" in the present invention. Each of the p-type source/drain regions 4b is constituted of a p-type high-concentration impurity region 5b and a p-type low-concentration impurity region 6b having a lower impurity concentration than the p-type high-concentration impurity region 5b. The p-type low-concentration impurity region 6b is formed on a region, shallower than the p-type high-concentration impurity region 5b, closer to a gate electrode 8b described later than the p-type high-concentration impurity region 5b.

A gate insulating film 27a is formed on the n-type channel region 3b. The gate insulating film 27a is an example of the "second gate insulating film" in the present invention. According to the first embodiment, the gate insulating film 27a of the p-channel MOS transistor 50b is formed by an $Al_2O_3$ film, which is a high dielectric constant (high-k) insulating film different from that of the $HfO_x$ film constituting the gate insulating film 7a of the n-channel MOS transistor 50a. The gate insulating film 27a is so formed by the $Al_2O_3$ film that a charge neutral point forming the center for pinning the Fermi level of the gate electrode 8b is located on a side closer to the conduction band of silicon on the interface between the gate insulating film 27a and the gate electrode 8b described later due to an effect of Al contained in the $Al_2O_3$ film. The gate insulating film 7b formed by the $Al_2O_3$ film has a thickness of not more than about 6 nm in terms of an oxide film ($SiO_2$ film). The gate electrode 8b is formed on the gate insulating film 27a. This gate electrode 8b is an example of the "second gate electrode" in the present invention. The gate electrode 8b is constituted of a metal-containing layer 29a formed on the gate insulating film 27a, a $p^+$-type lower polysilicon layer 30a formed on the metal-containing layer 29a and a $p^+$-type upper polysilicon layer 11b formed on the lower polysilicon layer 30a. The metal-containing layer 29a is an example of the "second metal-containing layer" in the present invention. The lower polysilicon layer 30a is an example of the "lower semiconductor layer" or the "second semiconductor layer" in the present invention, and the upper polysilicon layer 11b is an example of the "upper semiconductor layer" in the present invention.

The metal-containing layer 29a has an average thickness of less than about 3 nm (upon formation). The metal-containing layer 29a is formed in a dot pattern to partially cover the gate insulating film 27a, similarly to the aforementioned metal-containing layer 9a of the n-channel MOS transistor 50a. The metal-containing layer 29a contains TaN and Pt silicide (PtSi). Thus, according to the first embodiment, the metal-containing layer 29a of the gate electrode 8b of the p-channel MOS transistor 50b contains Pt silicide containing the metal (Pt) different from that of Hf silicide contained in the metal-containing layer 9a of the gate electrode 8a of the n-channel MOS transistor 50a. TaN contained in the metal-containing layer 29a has an effective work function corresponding to a portion around the mid gap of silicon. Further, Pt silicide (PtSi) contained in the metal-containing layer 29a forms a level around the conduction band of silicon. The Pt silicide (PtSi) contained in the metal-containing layer 29a is a material having an effective work function corresponding to a portion around the valence band of silicon as bulk, and this effective work function is at a value around the valence band of silicon if uninfluenced by interfacial reaction or interfacial charge. The $p^+$-type lower polysilicon layer 30a is in contact with portions of the gate insulating film 27a not covered with the metal-containing layer 29a through regions between adjacent dots of the metal-containing layer 29a. This lower polysilicon layer 30a has a thickness of about 10 nm. Further, the $p^+$-type lower polysilicon layer 30a has a Fermi level located around the valence band of silicon. The $p^+$-type upper polysilicon layer 11b has a thickness of about 100 nm, which is larger than the thickness (about 10 nm) of the lower polysilicon layer 30a. Side wall insulating films 12b of $SiO_2$ are formed on both side surfaces of the gate electrode 8b and the gate insulating film 27a respectively. The n-type channel region 3b, the pair of p-type source/drain regions 4b, the gate insulating film 27a and the gate electrode 8b constitute the p-channel MOS transistor 50b.

An interlayer dielectric film 14 of $SiO_2$ having a thickness of about 200 nm is so formed as to cover the element isolation films 2, the n-type high-concentration impurity regions 5a of the n-type source/drain regions 4a, the p-type high-concentration impurity regions 5b of the p-type source/drain regions 4b, the gate electrode 8a (8b) and the side wall insulating films 12a (12b). The interlayer dielectric film 14 is formed with contact holes 15a, 15b, 15c, 15d, 15e and 15f reaching the pair of n-type source/drain regions 4a, the pair of p-type source/drain regions 4b, the $n^+$-type upper polysilicon layer 11a and the $p^+$-type upper polysilicon layer 11b respectively. Plugs 16a, 16b, 16c, 16d, 17a and 17b of tungsten are embedded in the contact holes 15a, 15b, 15c, 15d, 15e and 15f respectively.

On the interlayer dielectric film 14, a wire 18 is formed to be connected with the plug 16a and another wire 19 is formed for connecting the plugs 16b and 16c with each other. Thus, one of the source/drain regions 4a of the n-channel MOS transistor 50a and one of the source/drain regions 4b of the p-channel MOS transistor 50b are connected with each other through the plugs 16b and 16c and the wire 19. Further, a wire 20 is formed on the interlayer dielectric film 14 to be connected with the plug 16d. In addition, wires 21a and 21b are formed on the interlayer dielectric film 14 to be connected with the plugs 17a and 17b respectively. The gate electrodes 8a and 8b of the n- and p-channel MOS transistors 50a and 50b are connected with each other through the plugs 17a and 17b and the wires 21a and 21b.

A process of fabricating the CMOS device according to the first embodiment of the present invention is now described with reference to FIGS. 1 to 15.

Figure 2:
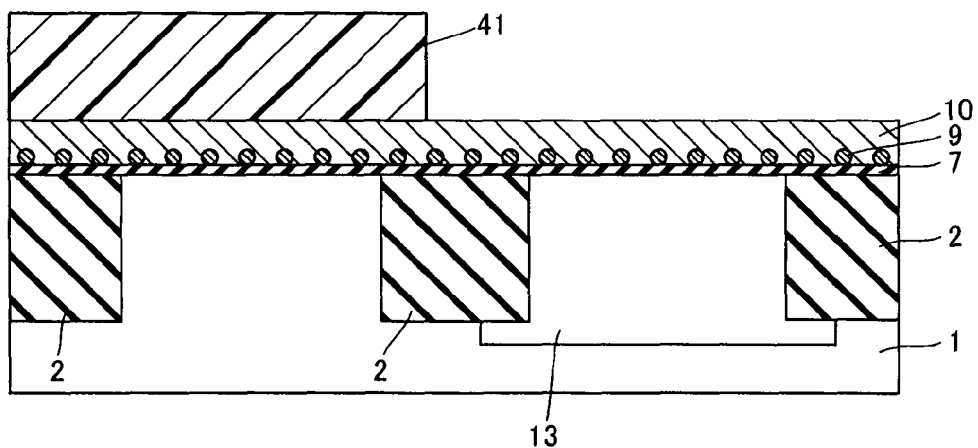
FIGS. 2 to 15 are sectional views for illustrating a process of fabricating the CMOS device according to the first embodiment of the present invention.

As shown in FIG. 2, the n-type well region 13 is formed on the region of the p-type silicon substrate 1 for forming the p-channel MOS transistor 50b (see FIG. 1). Portions of the silicon substrate 1 corresponding to the element isolation films 2 are removed by photolithography and etching, followed by formation of an $SiO_2$ film (not shown). Excessive depositional portions of the $SiO_2$ film are removed by CMP (chemical mechanical polishing) or etching-back, thereby forming the element isolation films 2 (see FIG. 2) of $SiO_2$. Thereafter a gate insulating film 7 of $HfO_x$ is formed by CVD (chemical vapor deposition) or sputtering, to cover the overall surface. This gate insulating film 7 of $HfO_x$ is formed with a thickness of not more than about 6 nm in terms of an oxide film ($SiO_2$ film).

According to the first embodiment, a TaN film having an average thickness of about 1 nm (upon formation) and an Hf film having an average thickness of less than about 1 nm (upon formation) are thereafter deposited on the gate insulating film 7 by CVD and sputtering respectively. At this time, the TaN film and the Hf film are not layered on the gate insulating film 7. In other words, the TaN film and the Hf film are conceivably formed on the gate insulating film 7 in a partially mixed state. Thus, a metal-containing layer 9 containing Hf and TaN is formed on the gate insulating film 7 with an average thickness of less than about 3 nm (upon formation). Thereafter an amorphous silicon layer 10 having a thickness of about 10 nm is deposited on the metal-containing layer 9 by CVD. The metal-containing layer 9 is conceivably flocculated in a dot pattern due to the small average thickness through the deposition of the amorphous silicon layer 10 by CVD, heat treatment for electrically activating impurities described later and heat supplied in remaining steps. Thus, the metal-containing layer 9 is formed in the dot pattern to partially cover the gate insulating film 7, while the amorphous silicon layer 10 is so formed as to come into contact with portions of the gate insulating film 7 not covered with the metal-containing layer 9 through regions between adjacent dots of the metal-containing layer 9. Hf contained in the metal-containing layer 9 and the gate insulating film 7 and silicon forming the amorphous silicon layer 10 react with each other through the heat supplied in these steps, thereby generating Hf silicide (HfSi). Thereafter a resist layer 41 is formed on a region of the amorphous silicon layer 10 for forming the n-channel MOS transistor 50a (see FIG. 1) by photolithography.

Figure 3:
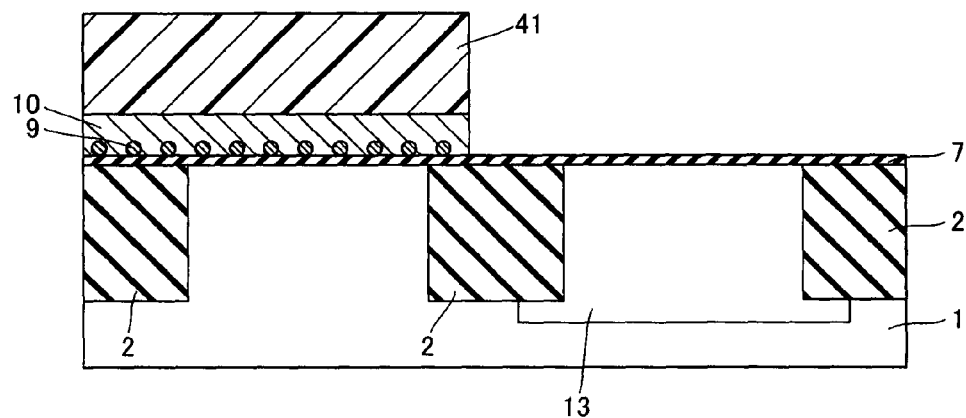
Figure 4:
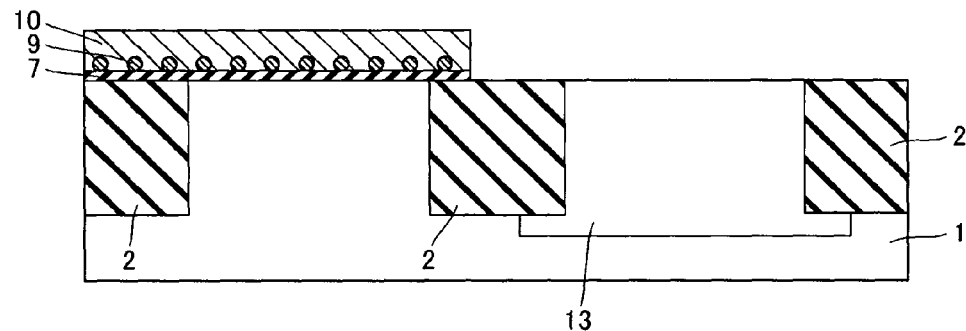

Then, the resist layer 41 is employed as a mask for etching the amorphous silicon layer 10 and the metal-containing layer 9 by RIE (reactive ion etching), thereby removing portions of the amorphous silicon layer 10 and the metal-containing layer 9 corresponding to the region for forming the p-channel MOS transistor 50b (see FIG. 1), as shown in FIG. 3. At this time, the portion of the amorphous silicon layer 10, formed with the thickness (about 10 nm) considerably smaller than the thickness (about 100 nm) of the upper polysilicon layers 11a and 11b (see FIG. 1) according to the first embodiment, can be easily removed by RIE. Thereafter the resist layer 41 is removed. As shown in FIG. 4, a portion of the gate insulating film 7 corresponding to the region for forming the p-channel MOS transistor 50b (see FIG. 1) is removed by wet etching with DHF (dilute hydrofluoric acid). According to the first embodiment, the portion of the metal-containing layer 9 corresponding to the region for forming the n-channel MOS transistor 50a (see FIG. 1) is covered with the amorphous silicon layer 10 and not removed by this wet etching.

Figure 5:
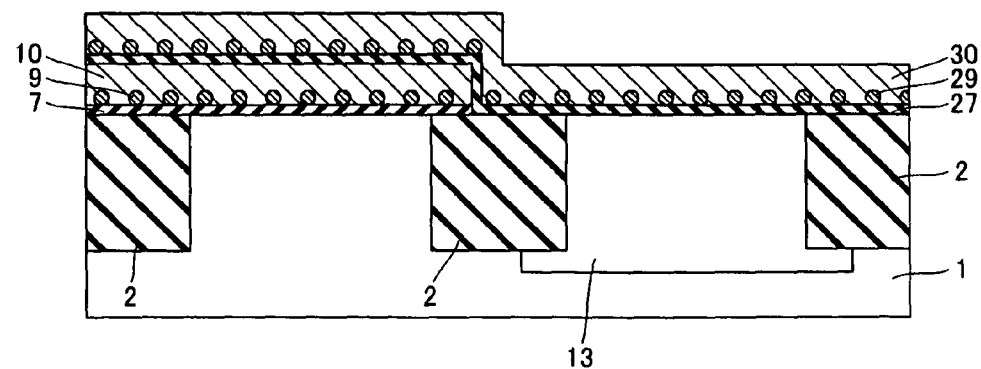

As shown in FIG. 5, a gate insulating film 27 of $Al_2O_3$ is formed by CVD or sputtering, to cover the overall surface. The gate insulating film 27 of $Al_2O_3$ is formed with a thickness of not more than about 6 nm in terms of an oxide film ($SiO_2$ film).

According to the first embodiment, a TaN film having an average thickness of about 1 nm (upon formation) and a Pt film having an average thickness of less than about 1 nm (upon formation) are thereafter deposited on the gate insulating film 27 by CVD and sputtering respectively. At this time, the TaN film and the Pt film are not layered on the gate insulating film 27. In other words, the TaN film and the Pt film are conceivably formed on the gate insulating film 27 in a partially mixed state. Thus, a metal-containing layer 29 containing Pt and TaN is formed on the gate insulating film 27 with an average thickness of less than about 3 nm (upon formation). Thereafter an amorphous silicon layer 30 having a thickness of about 10 nm is deposited on the metal-containing layer 29 by CVD. The metal-containing layer 29 is conceivably flocculated in a dot pattern due to the small average thickness through the deposition of the amorphous silicon layer 30 by CVD, heat treatment for electrically activating impurities described later and heat supplied in remaining steps. Thus, the metal-containing layer 29 is formed in the dot pattern to partially cover the gate insulating film 27, while the amorphous silicon layer 30 is so formed as to come into contact with portions of the gate insulating film 27 not covered with the metal-containing layer 29 through regions between adjacent dots of the metal-containing layer 29. Pt contained in the metal-containing layer 29 and silicon forming the amorphous silicon layer 30 react with each other through the heat supplied in these steps, thereby generating Pt silicide (PtSi).

Figure 6:
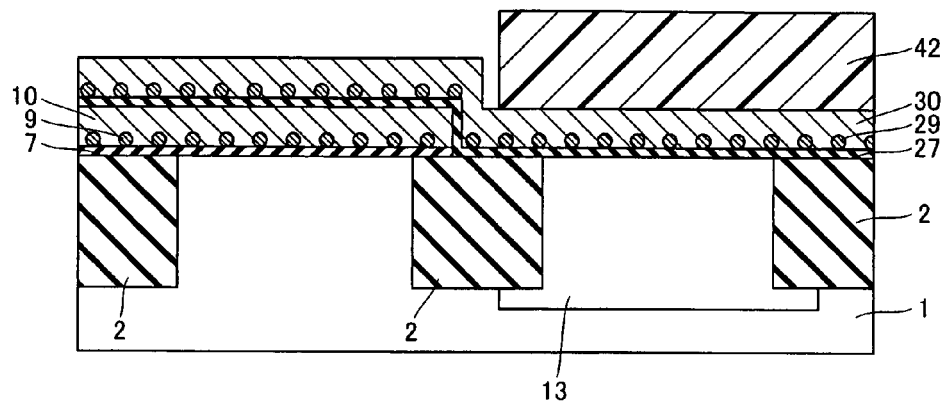
Figure 7:
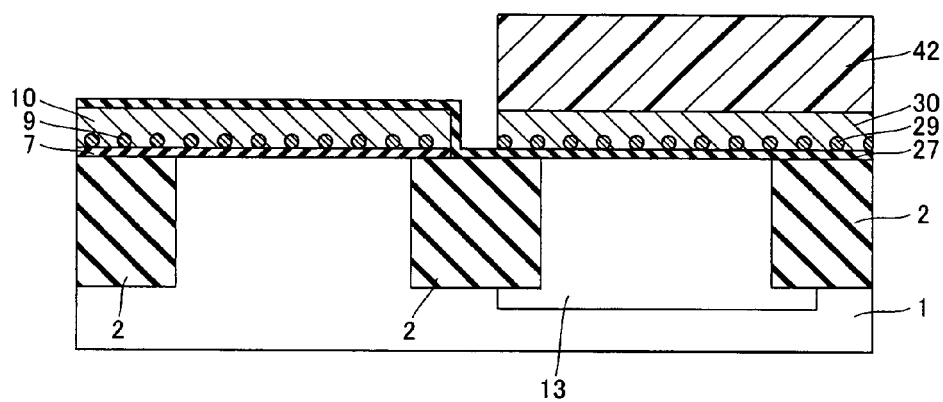

As shown in FIG. 6, a resist layer 42 is formed on a region of the amorphous silicon layer 30 for forming the p-channel MOS transistor 50b (see FIG. 1) by photolithography. As shown in FIG. 7, the resist layer 42 is employed as a mask for etching the amorphous silicon layer 30 and the metal-containing layer 29 by RIE, thereby removing portions of the amorphous silicon layer 30 and the metal-containing layer 29 other than those corresponding to the region for forming the p-channel MOS transistor 50b (see FIG. 1).

As shown in FIG. 6, a portion (step) of the amorphous silicon layer 30 located between the regions for forming the n- and p-channel MOS transistors 50a and 50b (see FIG. 1) respectively is larger in thickness by about 10 nm than the remaining portion. In the step shown in FIG. 7, therefore, the amorphous silicon layer 30 is overetched by the thickness of about 10 nm, thereby completely removing the thick step portion located between the regions for forming the n- and p-channel MOS transistors 50a and 50b (see FIG. 1) respectively. In this overetching period, the gate insulating film 27 of $Al_2O_3$ covering the amorphous silicon layer 10 on the region for forming the n-channel MOS transistor 50a (see FIG. 1) is exposed to an etching gas. At this time, however, the gate insulating film 27 is not completely removed by the overetching since the $Al_2O_3$ film has higher resistance against the etching gas than the amorphous silicon layer 30 and the overetching is performed in a short period for removing the thick step portion (about 10 nm) of the amorphous silicon layer 30. Thus, the amorphous silicon layer 10 located on the region for forming the n-channel MOS transistor 50a (see FIG. 1), located under the $Al_2O_3$ film, is not etched despite the aforementioned overetching. Thereafter the resist layer 42 is removed.

Figure 8:
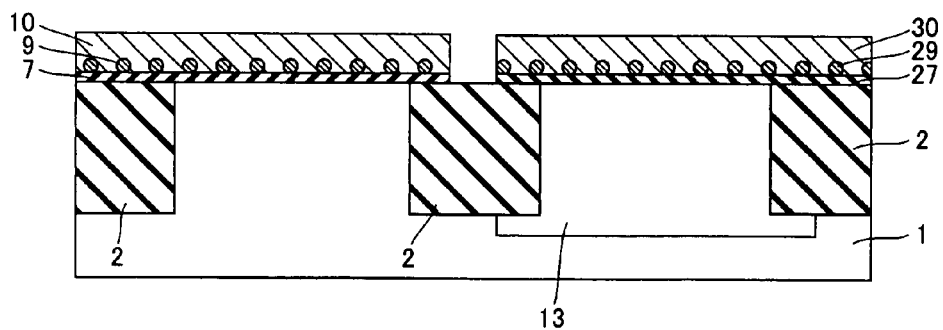
Figure 9:
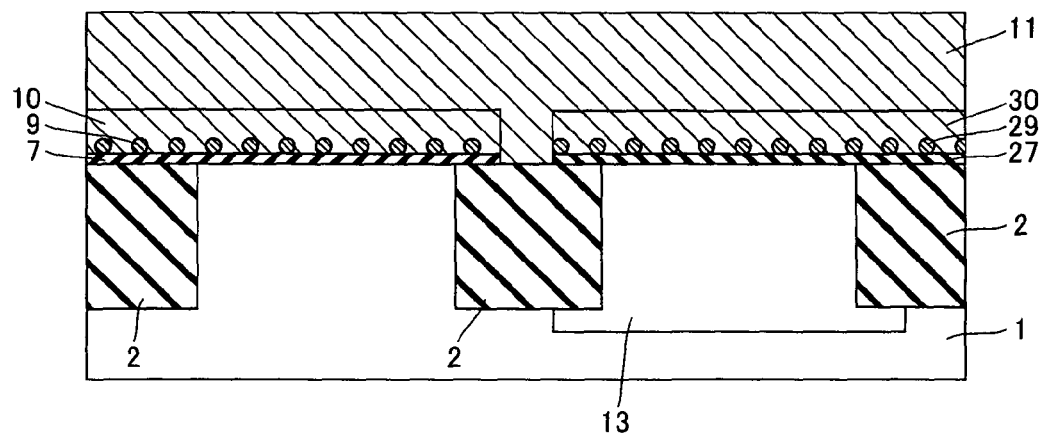
Figure 10:
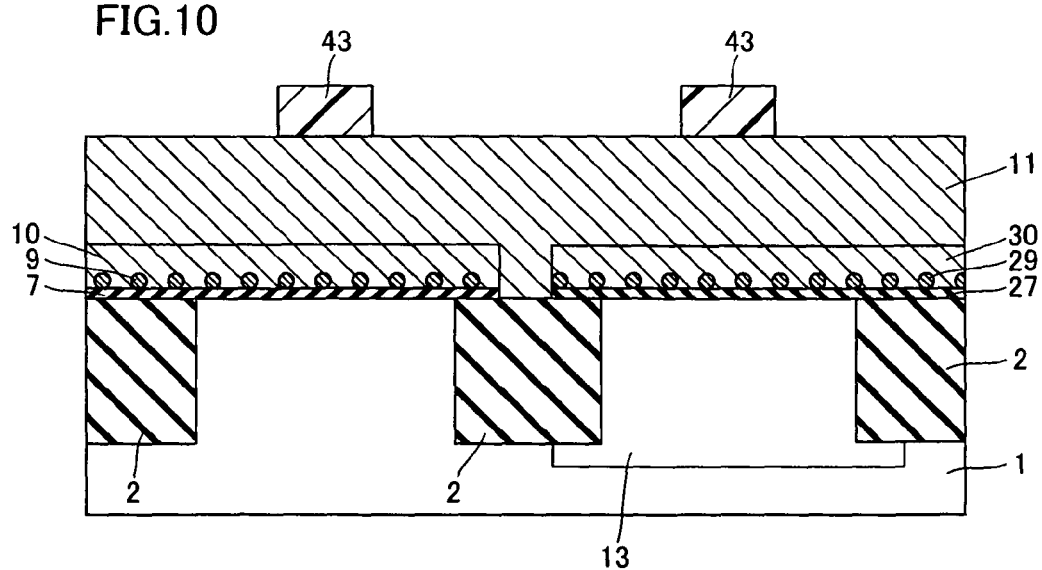
Figure 11:
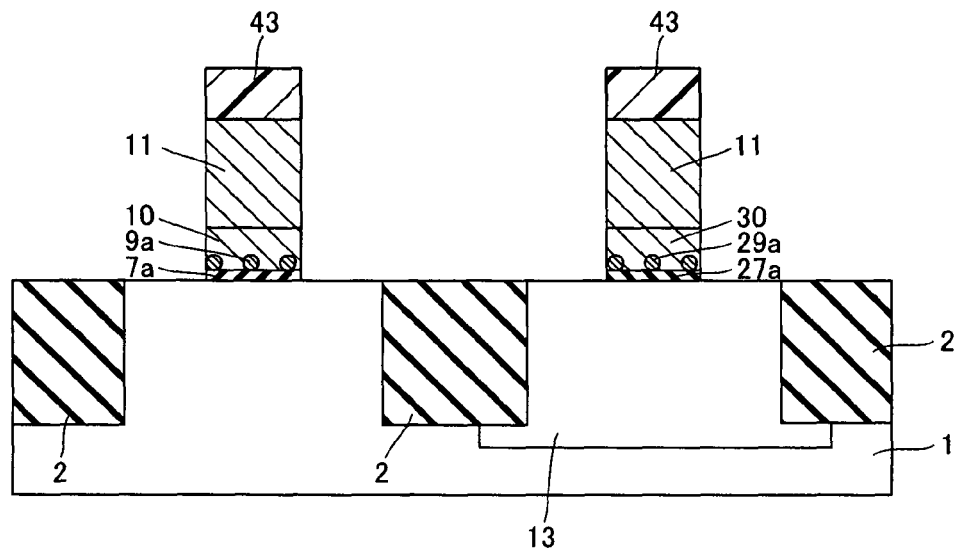

As shown in FIG. 8, a portion of the gate insulating film 27 other than that corresponding to the region for forming the p-channel MOS transistor 50b (see FIG. 1) is removed by wet etching with DHF (dilute hydrofluoric acid). According to the first embodiment, the portions of the metal-containing layers 9 and 29 corresponding to the regions for forming the n- and p-channel MOS transistors 50a and 50b (see FIG. 1) respectively are covered with the amorphous silicon layers 10 and 30 respectively and not removed by this wet etching. As shown in FIG. 9, an amorphous silicon layer 11 having a thickness of about 100 nm is formed by CVD to cover the overall surface. An interface observable with a TEM (transmission electron microscope) is formed between this amorphous silicon layer 11 and the amorphous silicon layers 10 and 30. Thereafter resist layers 43 are formed on regions of the amorphous silicon layer 11 for forming the gate electrodes 8a and 8b (see FIG. 1) respectively by photolithography, as shown in FIG. 10. The resist layers 43 are employed as masks for etching the amorphous silicon layers 11, 10 and 30, the metal-containing layers 9 and 29 and the gate insulating films 7 and 27, thereby forming amorphous silicon layers 11 and 10 and the metal-containing layer 9a corresponding to the gate electrode 8a (see FIG. 1), amorphous silicon layers 11 and 30 and the metal-containing layer 29a corresponding to the gate electrode 8b (see FIG. 1) and the gate insulating films 7a and 27a, as shown in FIG. 11. Thereafter the resist layers 43 are removed.

Figure 12:
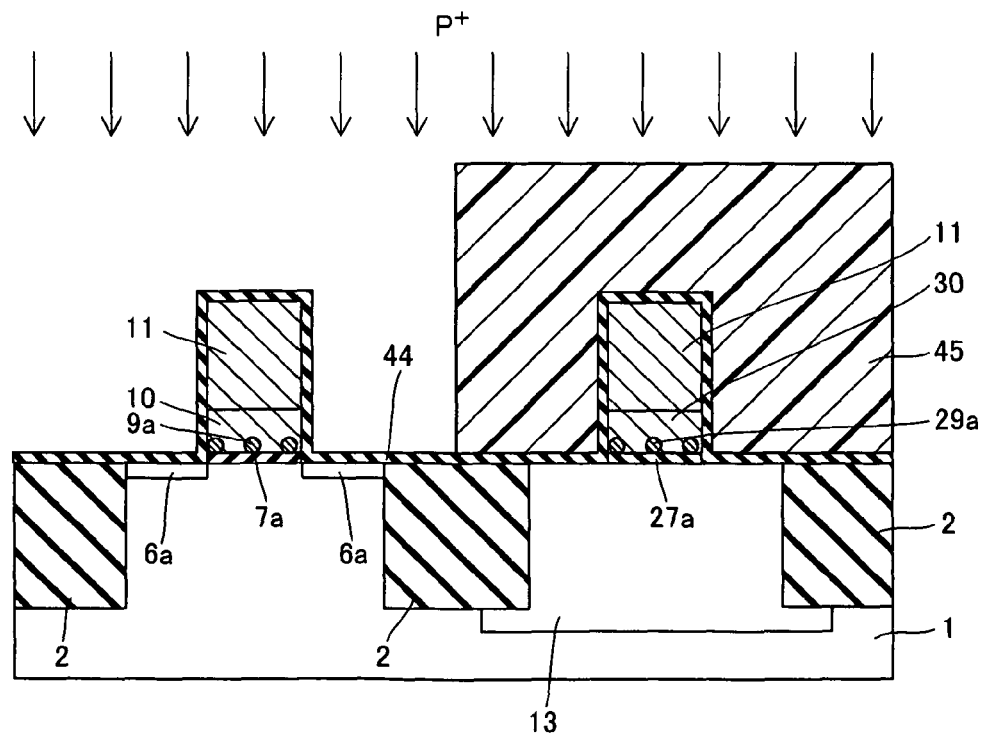

As shown in FIG. 12, a sacrificial oxide film 44 of $SiO_2$ having a thickness of about 10 nm is formed by CVD to cover the overall surface, in order to suppress damage around edges of the gate insulating films 7a and 27a resulting from ion implantation. Then, a resist layer 45 is formed by photolithography to cover a region of the sacrificial oxide film 44 for forming the p-channel MOS transistor 50b (see FIG. 1). Thereafter phosphorus (P) employed as an n-type impurity is ion-implanted in a low concentration. Thus, phosphorus (P) employed as the n-type impurity is introduced into the amorphous silicon layers 11 and 10 of the region for forming the n-channel MOS transistor 50a (see FIG. 1) and the n-type low-concentration impurity regions 6a of the source/drain regions 4a of the silicon substrate 1 through the sacrificial oxide film 44. Thereafter the resist layer 45 is removed.

Figure 13:
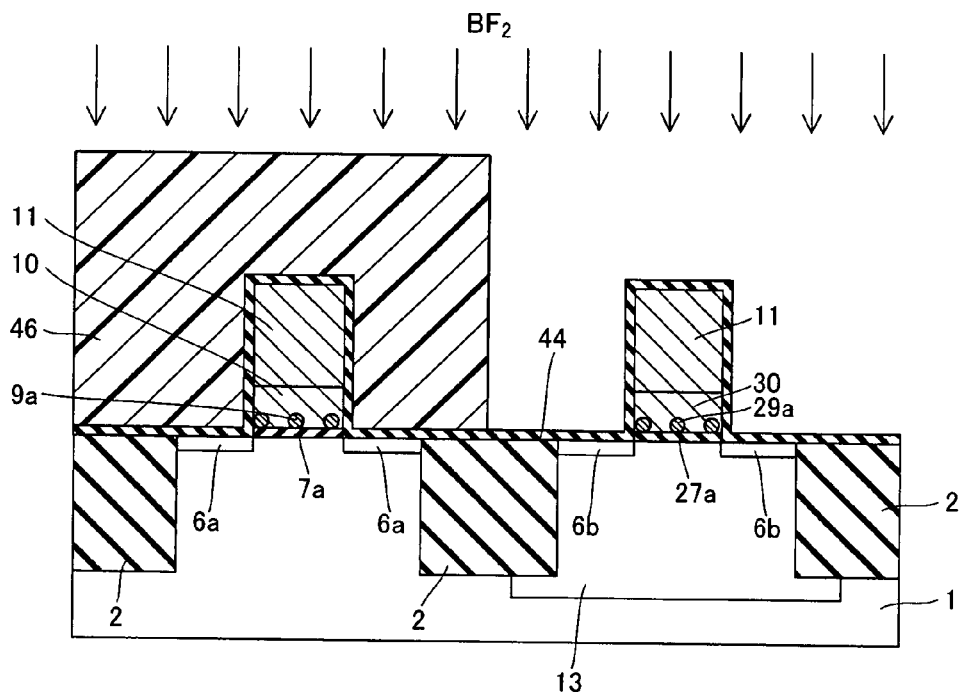
Figure 14:
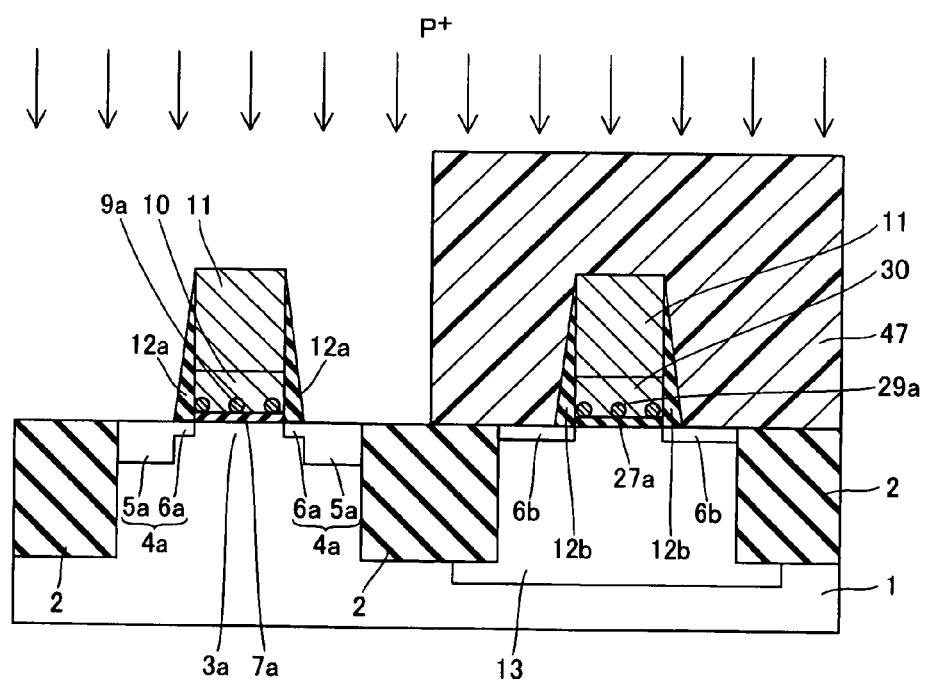

As shown in FIG. 13, a resist layer 46 is formed by photolithography to cover a region of the sacrificial oxide film 44 for forming the n-channel MOS transistor 50a (see FIG. 1). Thereafter $BF_2$ employed as a p-type impurity is ion-implanted in a low concentration. Thus, $BF_2$ employed as the p-type impurity is introduced into the amorphous silicon layers 11 and 30 of the region for forming the p-channel MOS transistor 50b (see FIG. 1) and the p-type low-concentration impurity regions 6b of the source/drain regions 4b of the silicon substrate 1 through the sacrificial oxide film 46. Thereafter the resist layer 46 is removed.

Then, an $SiO_2$ layer (not shown) is formed on the overall surface and thereafter etched back, thereby forming the side wall insulating films 12a of $SiO_2$ to cover both side surfaces of the amorphous silicon layers 11 and 10, the metal-containing layer 9a and the gate insulating film 7a of the region for forming the n-channel MOS transistor 50a (see FIG. 1) while forming the side wall insulating films 12b of $SiO_2$ to cover both side surfaces of the amorphous silicon layers 11 and 30, the metal-containing layer 29a and the gate insulating film 27a of the region for forming the p-channel MOS transistor 50b (see FIG. 1). Then, a resist layer 47 is formed by photolithography to cover the region for forming the p-channel MOS transistor 50b (see FIG. 1). Thereafter phosphorus (P) employed as the n-type impurity is ion-implanted. Thus, phosphorus (P) employed as the n-type impurity is introduced into the amorphous silicon layers 11 and 10 of the region for forming the n-channel MOS transistor 50a (see FIG. 1) and regions of the silicon substrate 1 for forming the n-type high-concentration impurity regions 5a of the source/drain regions 4a in a high concentration. At this time, the impurity (phosphorus) is introduced into the regions for forming the n-type high-concentration impurity regions 5a in a larger quantity than the n-type low-concentration impurity regions 6a. Further, the n-type high-concentration impurity regions 5a are formed up to regions deeper than the n-type low-concentration impurity regions 6a. Thus, the pair of n-type source/drain regions 4a consisting of the n-type high-concentration impurity regions 5a and the n-type low-concentration impurity regions 6a are formed on the region for forming the n-channel MOS transistor 50a (see FIG. 1) at the prescribed interval to hold the p-type channel region 3a therebetween. Thereafter the resist layer 47 is removed.

Figure 15:
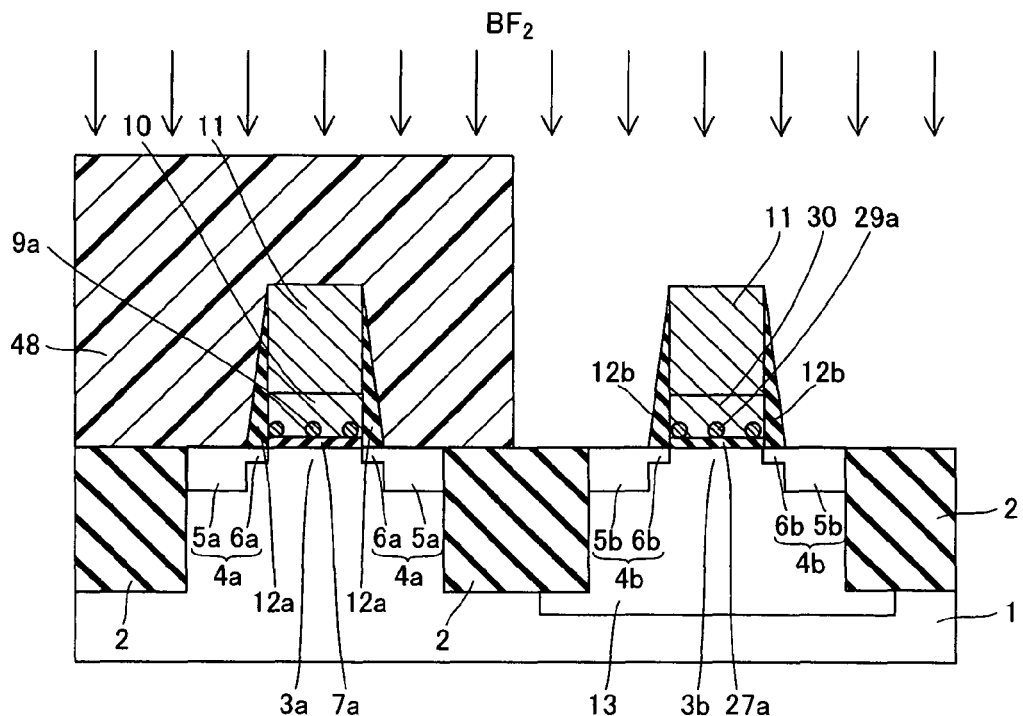

As shown in FIG. 15, a resist layer 48 is formed by photolithography to cover the region for forming the n-channel MOS transistor 50a (see FIG. 1). Thereafter $BF_2$ is ion-implanted as the p-type impurity. Thus, $BF_2$ employed as the p-type impurity is introduced into the amorphous silicon layers 11 and 30 of the region for forming the p-channel MOS transistor 50b (see FIG. 1) and the regions of the silicon substrate 1 for forming the p-type high-concentration impurity regions 5b of the source/drain regions 4b in a high concentration. At this time, the impurity ($BF_2$) is introduced into the regions for forming the p-type high-concentration impurity regions 5b in a larger quantity than the p-type low-concentration impurity regions 6b. Further, the p-type high-concentration impurity regions 5b are formed up to regions deeper than the p-type low-concentration impurity regions 6b. Thus, the pair of p-type source/drain regions 4b consisting of the p-type high-concentration impurity regions 5b and the p-type low-concentration impurity regions 6b are formed on the region for forming the p-channel MOS transistor 50b (see FIG. 1) at the prescribed interval to hold the n-type channel region 3b therebetween. Thereafter the resist layer 48 is removed.

As shown in FIG. 1, an $SiO_2$ film is deposited by CVD to cover the overall surface, thereby forming the interlayer dielectric film 14 having the thickness of about 200 nm. Thereafter the impurities implanted into the source/drain regions 4a and 4b and the amorphous silicon layers 10, 11 and 30 (see FIG. 15) are electrically activated by performing heat treatment (at about 950° C. for about 20 seconds) by RTA (rapid thermal annealing). The amorphous silicon layers 10, 11 and 30 (see FIG. 15) are crystallized through this heat treatment. Thus, the $n^+$-type upper and lower polysilicon layers 11a and 10a are formed on the region for forming the n-channel MOS transistor 50a while the $p^+$-type upper and lower polysilicon layers 11b and 30a are formed on the region for forming the p-channel MOS transistor 50b, as shown in FIG. 1. Further, the metal-containing layer 9a and the $n^+$-type lower and upper polysilicon layers 10a and 11a form the gate electrode 8a in the region for forming the n-channel MOS transistor 50a. In addition, the metal-containing layer 29a and the $p^+$-type lower and upper polysilicon layers 30a and 11b form the gate electrode 8b in the region for forming the p-channel MOS transistor 50b.

Then, the contact holes 15a, 15b, 15c, 15d, 15e and 15f are formed in the regions of the interlayer dielectric film 14 corresponding to the source/drain regions 4a and 4b and the upper polysilicon layers 11a and 11b respectively by photolithography and etching. Thereafter a tungsten layer is formed by CVD to fill up the contact holes 15a, 15b, 15c, 15d, 15e and 15f, and excessive depositional portions of the tungsten layer are removed by CMP, thereby forming the plugs 16a, 16b, 16c, 16d, 17a and 17b. Finally, the wires 18, 19, 20, 21a and 21b are formed on the prescribed regions of the upper surface of the interlayer dielectric film 14. The CMOS device according to the first embodiment is formed in the aforementioned manner, as shown in FIG. 1.

According to the first embodiment, as hereinabove described, the gate electrode 8a (8b), constituted of the lower polysilicon layer 10a (30a) and the metal-containing layer 9a (29a) formed to partially cover the gate insulating film 7a (27a), can be inhibited from depletion dissimilarly to a case of constituting the gate electrode 8a (8b) of only a polysilicon layer formed on the gate insulating film 7a (27a).

According to the first embodiment, the metal-containing layer 9a (29a) is formed in the dot pattern to partially cover the gate insulating film 7a (27a) while the lower polysilicon layer 10a (30a) located on the metal-containing layer 9a (29a) is formed to come into contact with the portions of the gate insulating film 7a (27a) not covered with the metal-containing layer 9a (29a), whereby stress resulting from the difference between the thermal expansion coefficient of the metal-containing layer 9a (29a) and those of the gate insulating film 7a (27a) and the silicon substrate 1 can be reduced. Thus, deterioration of electron mobility resulting from stress acting between the metal-containing layer 9a (29a) and the gate insulating film 7a (27a) and the silicon substrate 1 can be reduced.

According to the first embodiment, the metal-containing layer 9a of the gate electrode 8a of the n-channel MOS transistor 50a so contains Hf silicide that the Fermi level of the gate electrode 8a of the n-channel MOS transistor 50a can be rendered easily fixable to the level on the side closer to the conduction band of silicon. Thus, the effective work function of the gate electrode 8a of the n-channel MOS transistor 50a can be adjusted to a smaller level, whereby the threshold voltage of the n-channel MOS transistor 50a can be controlled to a lower level. Further, the metal-containing layer 29a of the gate electrode 8b of the p-channel MOS transistor 50b so contains Pt silicide that the Fermi level of the gate electrode 8b of the p-channel MOS transistor 50b can be rendered easily fixable to the level on the side closer to the valence band of silicon. Thus, the effective work function of the gate electrode 8b of the p-channel MOS transistor 50b can be adjusted to a larger level, whereby the threshold voltage of the p-channel MOS transistor 50b can be controlled to a lower level. In the CMOS device constituted of the n- and p-channel MOS transistors 50a and 50b, the threshold voltages of the n- and p-channel MOS transistors 50a and 50b can be individually controlled to lower levels in the aforementioned manner.

According to the first embodiment, the gate insulating films 7a and 27a of the n- and p-channel MOS transistors 50a and 50b are formed by the $HfO_x$ and $Al_2O_3$ films respectively, whereby the charge neutral point forming the center for pinning the Fermi level of the gate electrode 8a on the interface between the gate insulating film 7a and the gate electrode 8a of the n-channel MOS transistor 50a can be set to the side closer to the conduction band of silicon while another charge neutral point can be set to the side closer to the valence band of silicon on the interface between the gate insulating film 27a and the gate electrode 7a of the p-channel MOS transistor 60b. Thus, the charge neutral points forming the centers for pinning the Fermi levels of the gate electrodes 8a and 8b can be individually set to the sides closer to the conduction band and the valence side of silicon respectively in the n- and p-channel MOS transistors 50a and 50b constituting the CMOS device.

Second Embodiment

The structure of a CMOS device according to a second embodiment of the present invention is now described with reference to FIG. 16.

In the CMOS device according to the second embodiment, a gate electrode 58b of a p-channel MOS transistor 50b is constituted of lower and upper Pt silicide layers 30b and 11c, dissimilarly to the CMOS device according to the aforementioned first embodiment. Thus, the gate electrode 58b of the p-channel MOS transistor 50b has a Fermi level located around a valence band of silicon due to the action of Pt contained in the lower and upper Pt silicide layers 30b and 11c. The gate electrode 58b is an example of the "second gate electrode" in the present invention, and the lower and upper Pt silicide layers 30b and 11b are examples of the "metal silicide layer" in the present invention. The remaining structure of the CMOS device according to the second embodiment is similar to that of the CMOS device according to the aforementioned first embodiment.

A process of fabricating the CMOS device according to the second embodiment of the present invention is now described with reference to FIGS. 16 to 22.

According to the second embodiment, an element isolation film 2 and an n-type well region 13 are formed on a p-type silicon substrate 1 while a gate insulating film 7, a metal-containing layer 9 and an amorphous silicon layer 10 are formed on a region of the silicon substrate 1 for forming an n-channel MOS transistor 50a (see FIG. 16) through steps similar to those of the fabrication process according to the aforementioned first embodiment shown in FIGS. 2 to 4. As shown in FIG. 17, a gate insulating film 27 of $Al_2O_3$ is formed to cover the overall surface, similarly to the aforementioned first embodiment. Thereafter an amorphous silicon layer 30 having a thickness of about 10 nm is formed on the gate insulating film 27 by CVD.

Figure 18:
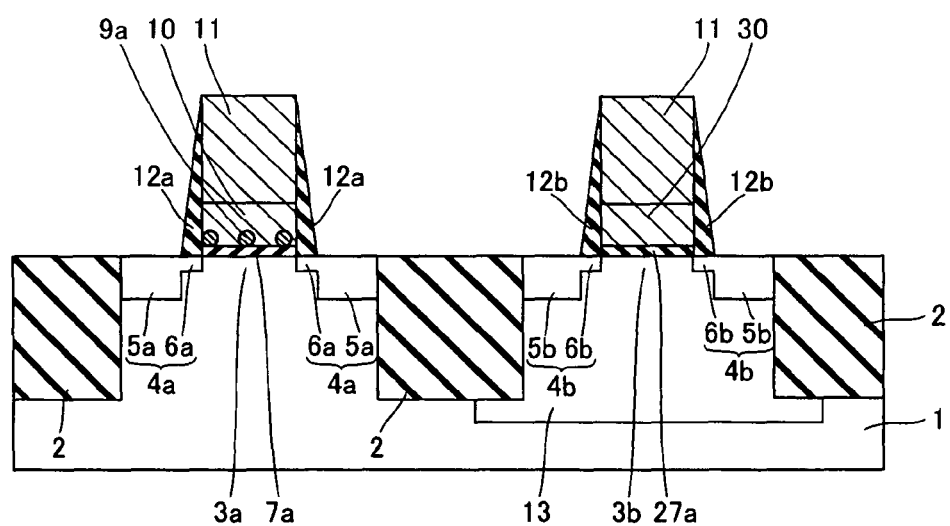

As shown in FIG. 18, amorphous silicon layers 11 and 10 and a metal-containing layer 9a corresponding to a gate electrode 8a (see FIG. 16), amorphous silicon layers 11 and 30 corresponding to the gate electrode 58b (see FIG. 16), gate insulating films 7a and 27a and side wall insulating films 12a and 12b are thereafter formed through steps similar to those of the fabrication process according to the aforementioned first embodiment shown in FIGS. 6 to 15. Further, a pair of n-type source/drain regions 4a consisting of n-type high-concentration impurity regions 5a and n-type low-concentration impurity regions 6a are formed on the region of the silicon substrate 1 for forming the n-channel MOS transistor 50a (see FIG. 16) to hold a p-type channel region 3a therebetween through steps similar to those of the fabrication process according to the aforementioned first embodiment shown in FIGS. 12 to 15. In addition, a pair of p-type source/drain regions 4b consisting of p-type high-concentration impurity regions 5b and p-type low-concentration impurity regions 6b are formed on a region of the silicon substrate 1 for forming the p-channel MOS transistor 50b (see FIG. 16) to hold an n-type channel region 3b therebetween.

Figure 19:
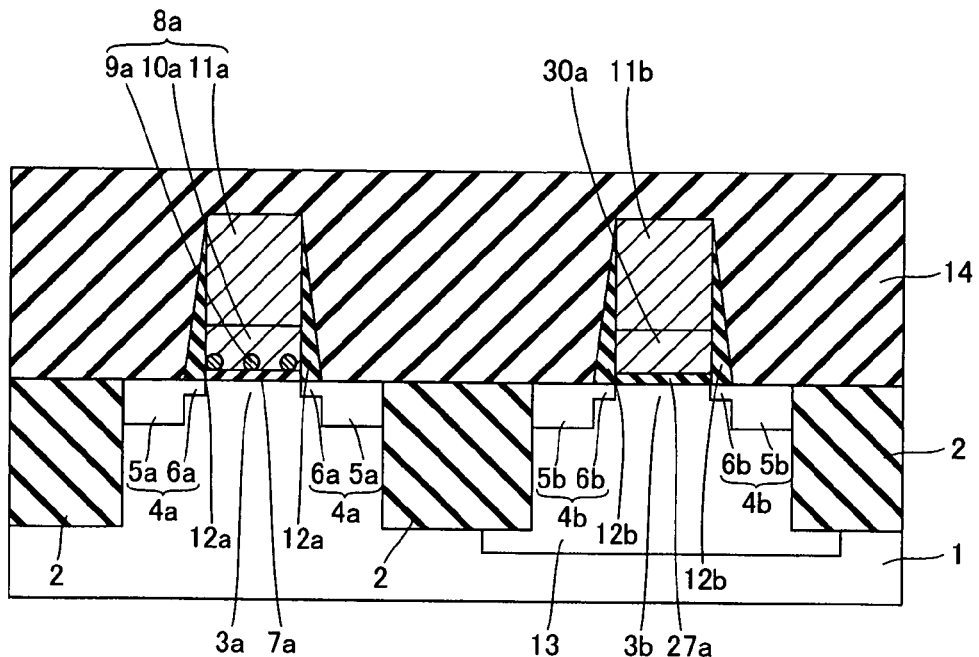
Figure 20:
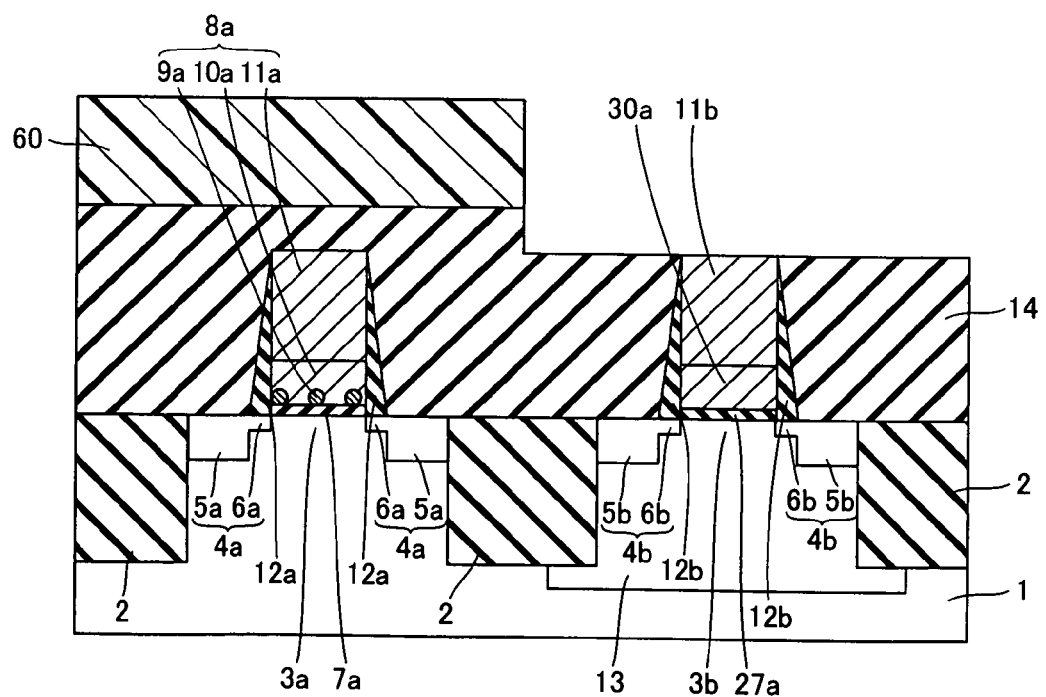

As shown in FIG. 19, an interlayer dielectric film 14 of $SiO_2$ having a thickness of about 200 nm is formed by CVD to cover the overall surface. Thereafter impurities introduced into the source/drain regions 4a and 4b and the amorphous silicon layers 10, 11 and 30 (see FIG. 18) are electrically activated by performing heat treatment (RTA) similar to that in the aforementioned first embodiment. Further, the amorphous silicon layers 10, 11 and 30 (see FIG. 18) are crystallized through this heat treatment. Thus, the gate electrode 8a is formed by the metal-containing layer 9a and $n^+$-type lower and upper polysilicon layers 10a and 11a on the region for forming the n-channel MOS transistor 50a (see FIG. 16). Further, $p^+$-type lower and upper polysilicon layers 30a and 11b corresponding to the gate electrode 58b (see FIG. 16) are formed on the region for forming the p-channel MOS transistor 50b (see FIG. 16). As shown in FIG. 20, a resist layer 60 is thereafter formed by photolithography to cover the remaining region of the interlayer dielectric film 14 excluding that for forming the p-channel MOS transistor 50b. The resist layer 60 is employed as a mask for etching the region of the interlayer dielectric film 14 corresponding to the region for forming the p-channel MOS transistor 50b (see FIG. 16) by RIE up to the upper surface of the upper polysilicon layer 11b. Thereafter the resist layer 60 is removed.

Figure 16:
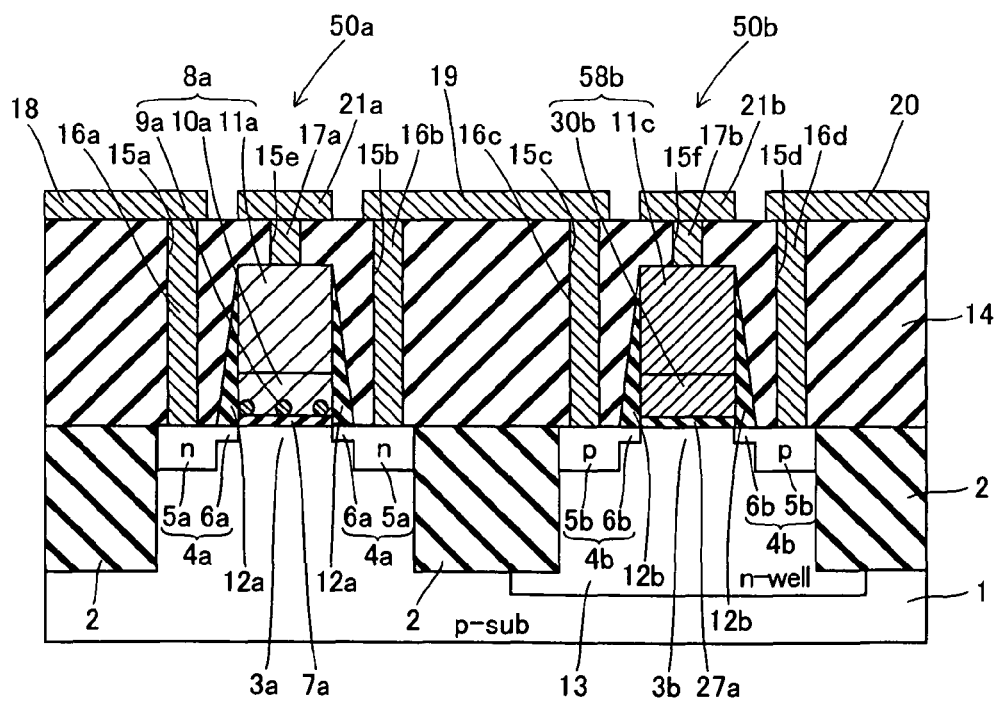
FIG. 16 is a sectional view showing the structure of a CMOS device according to a second embodiment of the present invention.
Figure 17:
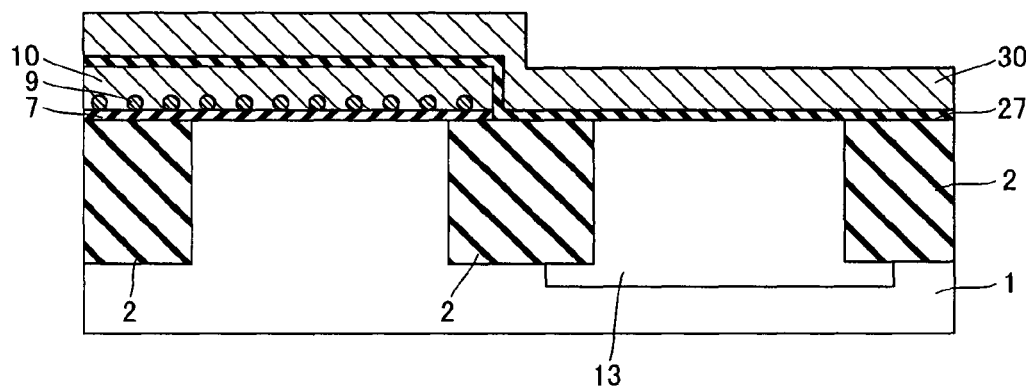
FIGS. 17 to 22 are sectional views for illustrating a process of fabricating the CMOS device according to the second embodiment of the present invention.
Figure 21:
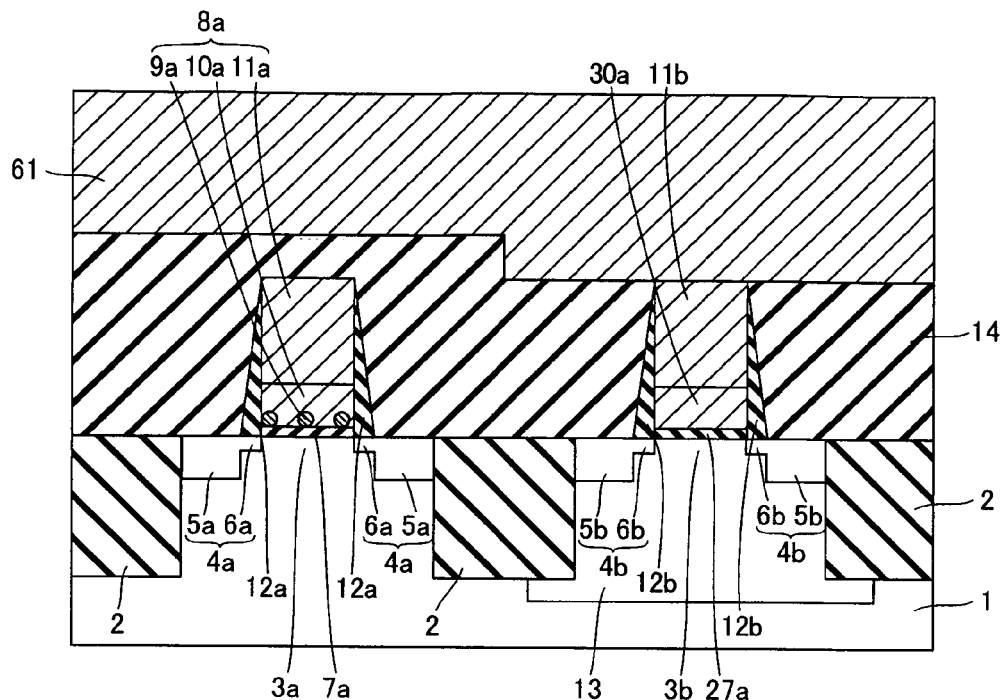
Figure 22:
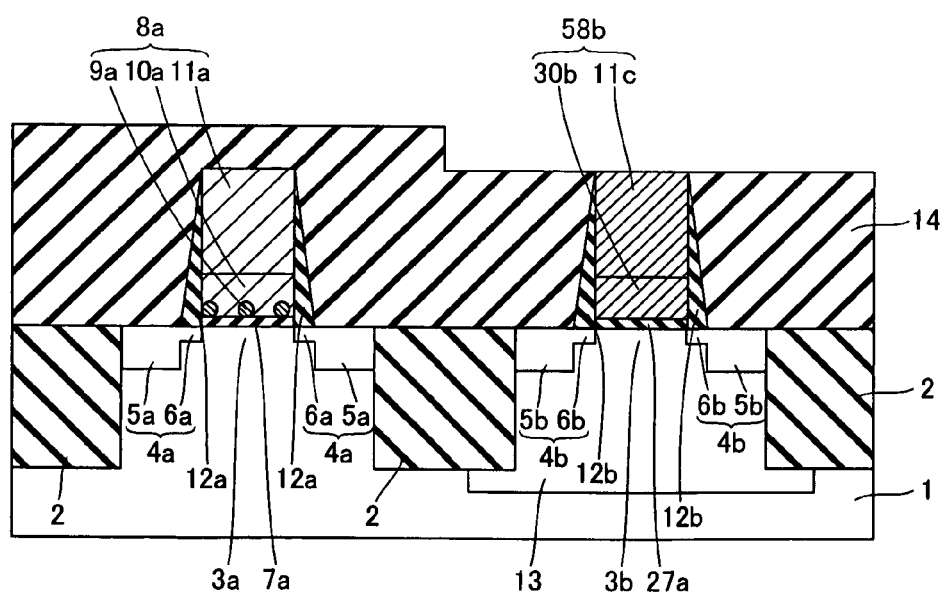

As shown in FIG. 21, a metal layer 61 of Pt is formed by CVD to cover the interlayer dielectric film 14 and the upper polysilicon layer 11b of the region for forming the p-channel MOS transistor 50b (see FIG. 16). This metal layer 61 is formed in a thickness allowing supply of Pt in a quantity sufficient for converting the material forming the upper and lower polysilicon layers 11b and 30a to metal(Pt)-rich Pt silicide (PtSi) in subsequent heat treatment. Thereafter heat treatment is performed at a temperature of about 500° C. so that silicon contained in the upper and lower polysilicon layers 11b and 30a and Pt contained in the metal layer 61 react with each other in the region for forming the p-channel MOS transistor 50b (see FIG. 16), thereby generating Pt silicide (PtSi). Thus, upper and lower Pt silicide layers 11c and 30b of Pt silicide (PtSi) are formed on the region for forming the p-channel MOS transistor 50b (see FIG. 16), as shown in FIG. 22. The upper and lower Pt silicide layers 11c and 30b form the gate electrode 58b of the p-channel MOS transistor 50b (see FIG. 16). Thereafter the remaining unreacted portions of the metal layer 61 left on the interlayer dielectric film 14 and the upper Pt silicide layer 11c are removed by wet etching. An $SiO_2$ film is formed by CVD to cover the overall surface, and the upper surface thereof is planarized by CMP. Thereafter contact holes 15a to 15f, plugs 16a to 16d, 17a and 17b and wires 18 to 20, 21a and 21b are formed through steps similar to those in the aforementioned first embodiment, thereby forming the CMOS device according to the second embodiment shown in FIG. 16.

According to the second embodiment, as hereinabove described, the metal-containing layer 9a of the gate electrode 8a of the n-channel MOS transistor 50a so contains Hf silicide that the Fermi level of the gate electrode 8a of the n-channel MOS transistor 50a can be rendered easily fixable to a level on a side closer to a conduction band of silicon. Thus, the effective work function of the gate electrode 8a of the n-channel MOS transistor 50a can be adjusted to a smaller level, whereby the threshold voltage of the n-channel MOS transistor 50a can be controlled to a lower level. Further, the gate electrode 58b of the p-channel MOS transistor 50b is so constituted of the lower and upper Pt silicide layers 30b and 11c that the Fermi level of the gate electrode 8b of the p-channel MOS transistor 50b can be rendered easily fixable to a level on a side closer to the valence band of silicon. Thus, the effective work function of the gate electrode 58b of the p-channel MOS transistor 50b can be adjusted to a larger level, whereby the threshold voltage of the p-channel MOS transistor 50b can be controlled to a lower level. In the CMOS device constituted of the n- and p-channel MOS transistors 50a and 50b, the threshold voltages of the n- and p-channel MOS transistors 50a and 50b can be individually controlled to lower levels in the aforementioned manner.

In addition to the aforementioned effect, the CMOS device according to the second embodiment can attain an effect of reducing deterioration of electron mobility while suppressing depletion of the gate electrode 8a in the n-channel MOS transistor 50a, similarly to the CMOS device according to the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while each of the first and second embodiments has been described with reference to the CMOS device employed as an exemplary semiconductor device according to the present invention, the present invention is not restricted to this but is also applicable to a semiconductor device other than the CMOS device.

While the gate electrode of the n-channel MOS transistor constituting the CMOS device is formed by the n-type polysilicon layers and the gate electrode of the p-channel MOS transistor is formed by the p-type polysilicon layers in the aforementioned first embodiment, the present invention is not restricted to this but the gate electrodes of the n- and p-channel MOS transistors constituting the CMOS device may alternatively be formed by polysilicon layers of the same conductive type.

While the gate electrode of the n-channel MOS transistor is formed by the n-type polysilicon layers in the aforementioned second embodiment, the present invention is not restricted to this but the gate electrode of the n-channel MOS transistor may alternatively be formed by p-type polysilicon layers.

While the metal-containing layers of the gate electrodes are formed in the dot pattern in each of the aforementioned first and second embodiments, the present invention is not restricted to this but the metal-containing layers of the gate electrodes may alternatively partially cover the gate insulating films in a pattern other than the dot pattern.

While the metal-containing layers formed on the gate insulating films are flocculated by the heat treatment to be in the dot pattern in each of the aforementioned first and second embodiments, the present invention is not restricted to this but the metal-containing layers may alternatively be formed in the dot pattern by a method different from the above. For example, the metal-containing layers may alternatively be formed on the gate insulating films already in the dot pattern by CVD under controlled conditions, without heat treatment.

While the metal-containing layers are flocculated to be in the dot pattern through the heat supplied in the step of depositing the amorphous silicon layers by CVD after forming the metal-containing layers of the gate electrodes, the heat treatment step for activating the impurities introduced into the source/drain regions and the amorphous silicon layers or still another step in each of the aforementioned first and second embodiments, the present invention is not restricted to this but the metal-containing layers may alternatively be flocculated in the dot pattern by performing heat treatment subsequently to formation of the metal-containing layers on the gate insulating films.

While the metal-containing layers of the gate electrodes contain TaN in each of the aforementioned first and second embodiments, the present invention is not restricted to this but another material may alternatively be employed in place of TaN contained in the metal-containing layers of the gate electrodes. For example, metal silicide such as TiSi or TaSi, a metal nitride or a simple metal substance may be employed in place of TaN. Further alternatively, the metal-containing layers may contain no TaN.

While the metal-containing layer of the gate electrode of the p-channel MOS transistor contains Pt silicide in the aforementioned first embodiment, the present invention is not restricted to this but the metal-containing layer of the gate electrode of the p-channel MOS transistor may alternatively contain another material containing a metal other than Pt, so far as the material can form a level on a side closer to the valence band of silicon than the mid gap. For example, a material containing a metal such as Ru or Ir in place of Pt may be employed.

While the gate electrode of the p-channel MOS transistor is formed by the Pt silicide layers in the aforementioned second embodiment, the present invention is not restricted to this but the gate electrode of the p-channel MOS transistor may alternatively be made of a material containing a metal other than Pt, so far as the material can form a level on a side closer to the valence band of silicon than the mid gap. For example, a material containing a metal such as Ru or Ir in place of Pt may be employed.

While the gate insulating films of the n- and p-channel MOS transistors are made of different materials ($HfO_x$ and $Al_2O_3$) respectively in each of the aforementioned first and second embodiments, the present invention is not restricted to this but the gate insulating films of the n- and p-channel MOS transistors may alternatively be made of the same material.

While the gate insulating films of the n- and p-channel MOS transistors are formed by the $HfO_x$ and $Al_2O_3$ films respectively in each of the aforementioned first and second embodiments, the present invention is not restricted to this but the gate insulating films of the n- and p-channel MOS transistors may alternatively be formed by films made of materials other than $HfO_x$ and $Al_2O_3$ respectively. In this case, the gate insulating film of the n-channel MOS transistor may be formed by a film of a material locating the charge neutral point forming the center for pinning the Fermi level of the gate electrode on the side closer to the valence band of silicon on the interface between eth gate insulating film and the gate electrode. Further, the gate insulating film of the p-channel MOS transistor may be formed by a film of a material locating the charge neutral point forming the center for pinning the Fermi level of the gate electrode on the side closer to the conduction band of silicon on the interface between the gate insulating film and the gate electrode.

While the CMOS device is formed by the silicon substrate in each of the aforementioned first and second embodiments, the present invention is not restricted to this but the CMOS device may alternatively be formed by a semiconductor substrate other than the silicon substrate. For example, the CMOS device may be formed by an SOI (silicon on insulator) substrate or the like.

While the gate electrode 8a of the n-channel MOS transistor 50a and the gate electrode 8b (58b) of the p-channel MOS transistor 50b are connected with each other through the plugs 17a and 17b and the wires 21a and 21b in each of the aforementioned first and second embodiments, the present invention is not restricted to this but the gate electrode 8a of the n-channel MOS transistor 50a and the gate electrode 8b (58b) of the p-channel MOS transistor 50b may alternatively be connected with each other through a structure other than the above. For example, a metal layer of Ti or Co for connecting the gate electrode 8a of the n-channel MOS transistor 50a and the gate electrode 8b (58b) of the p-channel MOS transistor 50b with each other may be formed by saliciding and subjected to heat treatment, thereby forming a silicide layer on the gate electrodes 8a and 8b (58b) and connecting the gate electrode 8a of the n-channel MOS transistor 50a and the gate electrode 8b (58b) of the p-channel MOS transistor 50b with each other through the silicide layer.

While HfSi contained in the metal-containing layer of the gate electrode of the n-channel MOS transistor is generated by bond reaction between Hf contained in the Hf film deposited on the gate insulating film and Si contained in the polysilicon layers in each of the aforementioned first and second embodiments, the present invention is not restricted to this but HfSi contained in the gate electrode of the n-channel MOS transistor may alternatively be generated by bond reaction between Hf contained in the gate insulating film ($HfO_x$ film) and Si contained in the polysilicon layers forming the gate electrode. In this case, no Hf film may be separately deposited on the gate insulating film ($HfO_x$ film), in order to generate HfSi contained in the metal-containing layer of the gate electrode of the n-channel MOS transistor.

While the gate electrodes of the n- and p-channel MOS transistors include the metal-containing layers containing different metals respectively in the aforementioned first embodiment, the present invention is not restricted to this but only the gate electrode of either the n-channel MOS transistor or the p-channel MOS transistor may alternatively include a metal-containing layer. In this case, the work function of the gate electrode including the metal-containing layer may be adjusted through the metal contained in the metal-containing layer, while the work function of the gate electrode including no metal-containing layer may be adjusted through the impurity introduced into the polysilicon layers constituting the gate electrode.

What is claimed is:

1. A semiconductor device comprising:
   a pair of first conductive type first source/drain regions formed on the main surface of a semiconductor region at a prescribed interval to hold a first channel region therebetween;
   a first gate electrode formed on said first channel region through a first gate insulating film;
   a pair of second conductive type second source/drain regions formed on the main surface of said semiconductor region at a prescribed interval to hold a second channel region therebetween; and
   a second gate electrode formed on said second channel region through a second gate insulating film, wherein
   at least either said first gate electrode or said second gate electrode includes a metal-containing layer which contains a metal other than a semiconductor material so formed as to partially cover the upper surface of corresponding said first gate insulating film or corresponding said second insulating film and a semiconductor layer formed on said metal-containing layer to come into contact with both a portion of the upper surface of corresponding said first gate insulating film or corresponding said second gate insulating film not covered with said metal-containing layer and said metal-containing layer,
   said first gate electrode and said second gate electrode contain metals different from each other,
   said first gate electrode includes a first metal-containing layer so formed as to partially cover said first gate insulating film and a first semiconductor layer formed on said first metal-containing layer to come into contact with a portion of said first gate insulating film not covered with said first metal-containing layer,
   said second gate electrode includes a second metal-containing layer so formed as to partially cover said second gate insulating film and a second semiconductor layer formed on said second metal-containing layer to come into contact with a portion of said second gate insulating film not covered with said second metal-containing layer,
   said first metal-containing layer and said second metal-containing layer contain metals different from each other,
   said first source/drain regions are n-type regions while said second source/drain regions are p-type regions,
   said first metal-containing layer contains a first metal forming a level on a side closer to a conduction band of said first semiconductor layer than an intermediate energy level between said conduction band and a valence band of said first semiconductor layer, and
   said second metal-containing layer contains a second metal forming a level on a side closer to a valence band of said second semiconductor layer than an intermediate energy level between a conduction band and said valence band of said second semiconductor layer, and
   said first metal-containing layer further contains a third metal forming a level around said intermediate energy level between said conduction band and said valence band of said first semiconductor layer in addition to said first metal.

2. The semiconductor device according to claim 1, wherein said metal-containing layer is formed in a dot pattern.

3. The semiconductor device according to claim 1, wherein said first gate insulating film and said second gate insulating film are made of materials different from each other.

4. The semiconductor device according to claim 1, wherein said semiconductor layer includes a lower semiconductor layer formed on said metal-containing layer and an upper semiconductor layer formed on said lower semiconductor layer with a thickness larger than the thickness of said lower semiconductor layer.

5. The semiconductor device according to claim 1, wherein said first source/drain regions are n-type regions while said second source/drain regions are p-type regions, and
   said first gate insulating film contains a metal forming a level on a side closer to a conduction band of said first semiconductor layer than an intermediate energy level between said conduction band and a valence band of said first semiconductor layer.

6. The semiconductor device according to claim 5, wherein said first gate insulating film includes an $HfO_x$ film.

7. The semiconductor device according to claim 1, wherein said first source/drain regions are n-type regions while said second source/drain regions are p-type regions, and
   said second gate insulating film contains a metal forming a level on a side closer to a valence band of said second semiconductor layer than an intermediate energy level between a conduction band and said valence band of said second semiconductor layer.

8. The semiconductor device according to claim 7, wherein said second gate insulating film includes an $Al_2O_3$ film.

9. The semiconductor device according to claim 1, wherein said first metal-containing layer includes a metal silicide layer containing said first metal, and
   said second metal-containing layer includes another metal silicide layer containing said second metal.

10. The semiconductor device according to claim 1, wherein
    said first metal is Hf, and said second metal is Pt.

11. The semiconductor device according to claim 1, wherein
    said second metal-containing layer further contains a fourth metal forming a level around said intermediate energy level between said conduction band and said valence band of said first semiconductor layer.

12. The semiconductor device according to claim 1, wherein said first gate electrode includes said metal-containing layer so formed as to partially cover said first gate insulating film and said semiconductor layer formed on said metal-containing layer to come into contact with a portion of said first gate insulating film not covered with said metal-containing layer, said second gate electrode consists of a metal silicide layer formed on said second gate insulating film, and said metal-containing layer and said metal silicide layer contain metals different from each other.

13. The semiconductor device according to claim 12, wherein said metal-containing layer is formed on said first gate insulating film in a dot pattern, and said metal silicide layer is so formed as to cover substantially the overall surface of said second gate insulating film.

14. The semiconductor device according to claim 12, wherein said first source/drain regions are n-type regions while said second source/drain regions are p-type regions, said metal-containing layer contains a metal forming a level on a side closer to a conduction band of said semiconductor layer than an intermediate energy level between said conduction band and a valence band of said semiconductor layer, and said metal silicide layer contains a metal forming a level on a side closer to a valence band of silicon than an intermediate energy level between a conduction band and said valence band of silicon.

15. The semiconductor device according to claim 12, wherein said metal silicide layer includes a lower metal silicide layer so formed as to come into contact with said second gate insulating film and an upper metal silicide layer formed on said lower metal silicide layer with a thickness larger than the thickness of said lower metal silicide layer.

* * * * *